(12) United States Patent
Stewart

(10) Patent No.: US 9,712,048 B2
(45) Date of Patent: Jul. 18, 2017

(54) ALGORITHM FOR PASSIVE POWER FACTOR COMPENSATION METHOD WITH DIFFERENTIAL CAPACITOR CHANGE AND REDUCED LINE TRANSIENT NOISE

(71) Applicant: Edge Electrons Limited, Hong Kong (HK)

(72) Inventor: Neal George Stewart, Hong Kong (HK)

(73) Assignee: Edge Electrons Limited, Hong Kong (HK)

( * ) Notice: Subject to any disclaimer, the term of this patent is extended or adjusted under 35 U.S.C. 154(b) by 0 days.

(21) Appl. No.: 14/781,040

(22) PCT Filed: Mar. 31, 2014

(86) PCT No.: PCT/CN2014/074477
§ 371 (c)(1),
(2) Date: Sep. 29, 2015

(87) PCT Pub. No.: WO2014/161459
PCT Pub. Date: Oct. 9, 2014

(65) Prior Publication Data
US 2016/0043635 A1    Feb. 11, 2016

Related U.S. Application Data

(60) Provisional application No. 61/806,868, filed on Mar. 30, 2013.

(51) Int. Cl.
*H02M 1/42*  (2007.01)
*H02J 3/18*  (2006.01)
(Continued)

(52) U.S. Cl.
CPC ........ *H02M 1/4266* (2013.01); *G01R 21/003* (2013.01); *G01R 21/006* (2013.01);
(Continued)

(58) Field of Classification Search
CPC ... H02M 1/4266; G01R 23/02; G01R 21/006; G01R 21/06; G01R 21/003; H02J 3/1828; Y02E 40/30
(Continued)

(56) References Cited

U.S. PATENT DOCUMENTS 4,633,223 A * 12/1986 Senderowicz .......... H03F 3/005
                                                  330/9
4,672,298 A *  6/1987 Rohatyn .................... G05F 1/70
                                                  323/208

(Continued)

OTHER PUBLICATIONS

Received search report from EIC 2800 STIC searcher Benjamin Martin on Aug. 31, 2016.*

*Primary Examiner* — Gary L Laxton
*Assistant Examiner* — Htet Z Kyaw
(74) *Attorney, Agent, or Firm* — Idea Intellectual Limited; Margaret A. Burke; Sam T. Yip

(57) ABSTRACT

A computer-implementable control algorithm that measures: 1) the reactive power; 2) the power factor; 3) the voltage; and 4) the line frequency. The algorithm calculates the differential compensation capacitance required that is either positive (capacitance to be added), or negative (capacitance to be removed). The new compensation capacitance is calculated from the sum or difference of the differential compensation capacitance and the current compensation capacitance. The algorithm compares the capacitor switching bit pattern for the current compensation capacitance and the capacitor switching bit pattern for the new compensation capacitance, and selects a capacitor switching bit map accordingly. The capacitor switch combination for the new compensation capacitance is switched in incrementally according to the capacitor switching bit map. To reach the selected capacitor switch combination, only one switch is switched at a time to minimize the line transient noise. This (Continued)

part of the algorithm continues to run until the PF is corrected, with the capacitor switches being switched on/off each delayed by a millisecond interval to minimize line transient noise.

5 Claims, 10 Drawing Sheets

(51) Int. Cl.
    *G01R 21/00*     (2006.01)
    *G01R 21/06*     (2006.01)
    *G01R 23/02*     (2006.01)

(52) U.S. Cl.
    CPC ............. *G01R 21/06* (2013.01); *G01R 23/02* (2013.01); *H02J 3/1828* (2013.01); *Y02E 40/30* (2013.01)

(58) Field of Classification Search
    USPC .......................................................... 323/208
    See application file for complete search history.

(56) References Cited

U.S. PATENT DOCUMENTS

| | | | | |
|---|---|---|---|---|
| 4,677,364 A * | 6/1987 | Williams | .............. | H02J 3/1864 318/729 |
| 6,121,758 A * | 9/2000 | Bellina | ................ | H02J 3/1828 323/210 |
| 6,462,519 B1 * | 10/2002 | McDaniel | ................ | G05F 1/70 323/211 |
| 7,091,703 B2 * | 8/2006 | Folts | ..................... | H02J 3/1828 323/207 |
| 7,872,453 B2 * | 1/2011 | Su | ......................... | H02J 3/1828 323/209 |
| 8,164,504 B2 * | 4/2012 | Cho | .................... | H03M 1/0678 341/118 |
| 8,310,098 B2 * | 11/2012 | Kumar | ..................... | H02M 3/06 307/109 |
| 8,421,658 B1 * | 4/2013 | Yau | ...................... | H03M 1/1004 341/118 |
| 8,638,598 B1 * | 1/2014 | Lam | ........................ | G11C 11/56 365/148 |
| 8,639,389 B2 * | 1/2014 | Vukojevic | ............. | H02J 3/1828 307/109 |
| 8,838,285 B2 * | 9/2014 | Milosevic | ................. | H02J 3/00 700/286 |
| 9,077,355 B2 * | 7/2015 | van der Goes | ....... | H03M 1/403 |
| 9,454,196 B2 * | 9/2016 | Knoth | ........................ | H02J 1/02 |
| 2002/0180408 A1 * | 12/2002 | McDaniel | ................. | G05F 1/70 323/211 |
| 2004/0164718 A1 * | 8/2004 | McDaniel | ................. | G05F 1/70 323/211 |
| 2006/0250117 A1 * | 11/2006 | Rayburn | ................... | G05F 1/70 323/209 |
| 2008/0106241 A1 * | 5/2008 | Deaver | ................. | H02J 3/1828 323/209 |
| 2011/0273354 A1 * | 11/2011 | Davidson | ............... | H01Q 9/145 343/852 |
| 2012/0022713 A1 * | 1/2012 | Deaver, Sr. | ............ | G05B 17/02 700/298 |
| 2013/0204554 A1 * | 8/2013 | Tuckey | .............. | G01R 19/2513 702/58 |
| 2014/0092694 A1 * | 4/2014 | Lam | ........................ | G11C 7/00 365/189.011 |
| 2014/0139198 A1 * | 5/2014 | Manlove | ................... | G05F 1/10 323/282 |
| 2015/0054668 A1 * | 2/2015 | van der Goes | ....... | H03M 1/403 341/172 |

* cited by examiner

Example when transition from bit pattern 1 0 1 to 1 1 0

The switching sequence is:

| Step | MSB | | LSB | Remark |
|---|---|---|---|---|
| 1 | 1 | 0 | 1 | Starting state |
| 2 | 1 | 0 | 0 | Disengage capacitor starting from LSB |
| 3 | 0 | 0 | 0 | Disengage next higher bit capacitor |
| 4 | 0 | 1 | 0 | Engage capacitance starting from lowest bit |
| 5 | 1 | 1 | 0 | Complete transition |

FIG. 3E

| Entry | Description | Data Length Bits | Coding | Number Range | Unit |
|---|---|---|---|---|---|
| 0 | Date length | 16 | Unsigned binary | 0-65535 | |
| 1 | Number of capacitor or number of bits for capacitor bank control | 8 | Unsigned binary | 1 to 5 Other invalid | |
| 2 | Capacitance of bit0 capacitor | 8 | Unsigned binary | 0-255 | uF |
| 3 | Capacitance of bit1 capacitor | 8 | Unsigned binary | 0-255 | uF |
| 4 | ... | 8 | Unsigned binary | 0-255 | uF |
| ... | Capacitance of bitn | 8 | Unsigned binary | 0-255 | uF |
| Q | Checksum | 8 | 1's complement of arithmetic sum of loc 0 to loc Q-1 | | |

FIG. 4

| Vac Nom VAC RMS | Line Freq (Hz) | # Ph | Pwr per Phase (W) | Min Pf @Vnom | Max VAR | C3 (uF) | C2 (uF) | C1 (uF) | C0 (uF) | Ctot (uF) |
|---|---|---|---|---|---|---|---|---|---|---|
| 240 | 50 | 3 | 2500 | 0.776 | 1576 | N/A | 50 | 25 | 12 | 87 |
| 240 | 50 | 3 | 1167 | 0.7452 | 942 | N/A | 25 | 12 | 6 | 43 |
| 240 | 50 | 1 | 3500 | 0.700 | 2516 | N/A | 82 | 39 | 18 | 139 |

ALGORITHM FOR PASSIVE POWER FACTOR COMPENSATION METHOD WITH DIFFERENTIAL CAPACITOR CHANGE AND REDUCED LINE TRANSIENT NOISE

CLAIM FOR PRIORITY

The present application is a national phase application of the international patent application number PCT/CN2014/074477 filed on Mar. 31, 2014 which claims priority from the U.S. Provisional Patent Application No. 61/806,868, filed Mar. 30, 2013, the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to electrical power generation and distribution. Particularly, the present invention relates to electrical power quality compensation methods and systems.

BACKGROUND

Power quality is an increasing problem in mains electrical distribution systems with the addition of many different modern electrical appliances and electronic devices. In an Alternating Current (AC) mains electrical system, there is an alternating positive and negative sine voltage wave, at either 50 or 60 Hz frequencies, depending on the country. In an AC system, the current also has a sine waveform, but has a particular phase angle in relation to the voltage waveform. It is well know that as inductive loads are connected to the electrical system, the current begins to lag the voltage waveform due the reactance of the inductive load. The phase difference between the voltage and the current is related as a Power Factor (PF). When the voltage and current are correctly in phase, the PF equals to one (PF=1). As inductive loads are added, the PF falls as the current begins to lag the voltage waveform. This causes serious consequences in terms of electricity cost, and penalties that can be levied for a low PF, which adds to the costs of electrical generation and transmission. For example, at PF<0.7, the heavy levies and additional charges can begin to pass down to billings to end users.

There are passive power quality compensation devices that rely on switching in various line capacitors across the electrical system phases that compensate for the inductive loads, and correct the PF back to high levels closer to 1, hence restore the power quality. With these passive power quality compensation devices, first, the PF is measured; second, the amount of the capacitance required is calculated by various means, such as deriving from a look-up table, minimum and maximum limits, etc.; then finally the amount of capacitance is switched in.

SUMMARY

It is an objective of the presently claimed invention to provide a computer-implementable control algorithm for passive power factor compensation based on differential capacitor change. It is a further objective of the presently claimed invention to provide such algorithm that can reduce line transient noise during the differential capacitor change.

In accordance with various embodiments, the present invention utilizes a computer-implementable control algorithm that measures: 1) the reactive power; 2) the PF; 3) the voltage; and 4) the line frequency. The computer-implementable control algorithm calculates the differential compensation capacitance that is either positive (capacitance to be added), or negative (capacitance to be removed). Also it looks at the limits of the differential capacitance needed, and if within the minimum limits, then the algorithm will not proceed to change any capacitance, and this part of the algorithm limits the switching frequency of the capacitors.

Once the differential compensation capacitance required, either positive (capacitance to be added) or negative (capacitance to be removed), is determined, and is also outside the minimum limits, the new compensation capacitance is calculated from the sum or difference of the differential compensation capacitance and the current compensation capacitance. The algorithm compares the capacitor switching bit pattern for the current compensation capacitance and the capacitor switching bit pattern for the new compensation capacitance, and selects a capacitor switching bit map accordingly. The capacitor switch combination for the new compensation capacitance is switched in incrementally according to the capacitor switching bit map. To reach the selected capacitor switch combination, only one switch is switched at a time to minimize the line transient noise. This part of the algorithm continues to run until the PF is corrected, with the capacitor switches being switched on/off one by one each delayed by a millisecond interval to minimize line transient noise.

Every 15 minutes the algorithm again measures: 1) the reactive power; 2) the PF; 3) the voltage; and 4) the line frequency. The algorithm again runs through the routine and looks at the minimum limits of the differential capacitance value, and the need to enter into the capacitor pattern change.

The voltage zero crossing of line power may be optionally monitored. The switch on and switch off instant of relays will be timed such that relay contact are opened or closed when instantaneous voltage of power line is near zero to further reduce switching disturbances.

BRIEF DESCRIPTION OF THE DRAWINGS

Embodiments of the invention are described in more detail hereinafter with reference to the drawings, in which

FIG. 3E depicts a table illustrating the bit pattern transition corresponding to an exemplary engagement of compensation capacitors;

FIG. 4 depicts a table illustrating an exemplary embodiment of the data structure for the compensation capacitance values and parameters stored in external non-volatile storage;

DETAILED DESCRIPTION

In the following description, methods and systems incorporating a computer-implementable control algorithm for passive power factor compensation based on differential capacitor change and the like are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 1:
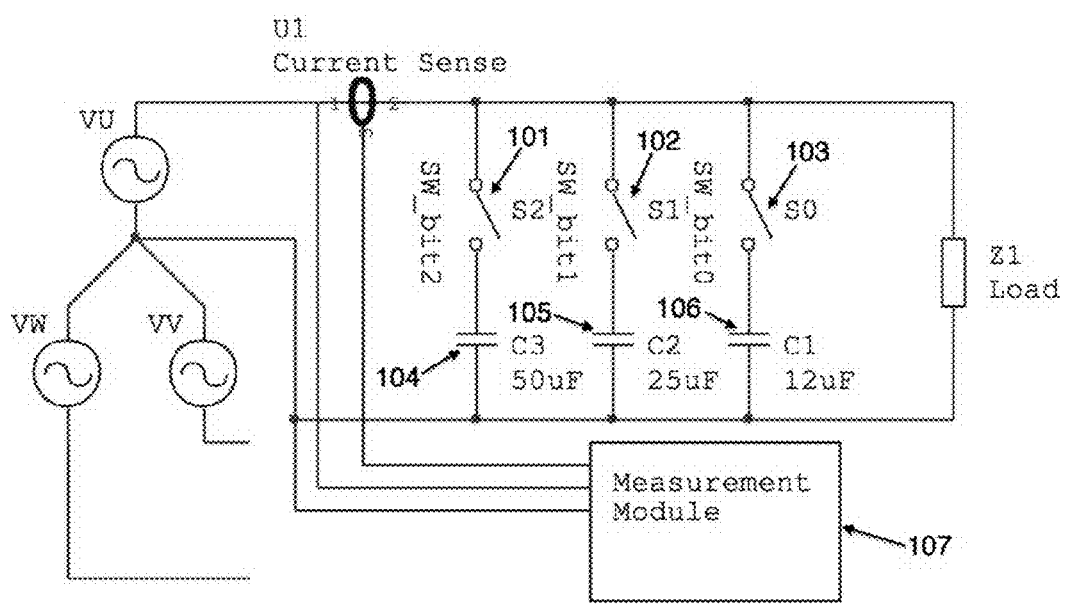
FIG. 1 shows a circuit diagram illustrating an exemplary electrical power circuitry incorporated with a computer-implementable control algorithm for passive power factor compensation based on differential capacitor change in accordance to an embodiment of the presently claimed invention.

FIG. 1 shows a circuit diagram illustrating an exemplary electrical power circuitry incorporated with a computer-implementable control algorithm for passive power factor compensation based on differential capacitor change in accordance to an embodiment of the presently claimed invention. This electrical power circuitry is for a three-phase system; however, the similar configuration can be applied to other two-phase systems. In this electrical power circuitry, the three capacitors $C_1$ (106), $C_2$ (105), and $C_3$ (104) can be switched in or out individually by their corresponding switches $SW_{bit0}$ (103), $SW_{bit1}$ (102), and $SW_{bit2}$ (101) according to the determined compensation capacitance required for power quality compensation. In addition, the measurement module (107) collects the power line quality data, including voltage, current, power factor, real power, and reactive power.

The positions and states of the switches can be represented in binary form in the control algorithm. One exemplary embodiment is as follows:

TABLE 1

Bit Values and Capacitance

| | $Switch_{bit}$ | | |
|---|---|---|---|
| | 2 (MSB) | 1 | 0 (LSB) |
| Capacitance | 50 uF | 25 uF | 12 uF |

Table 1

To minimize the line transient noise, to reach the selected capacitor switch combination, only one switch is switched at a time. Referring to Table 2 below. For example, if the compensation capacitance required is to be increased to 62 uF from the current 25 uF, the changes in the states of the three switches are to go through State 3, State 4, then finally State 5 in sequential order.

TABLE 2

| | $Switch_{bit}$ | | | |
|---|---|---|---|---|
| State | bit2 | bit1 | bit0 | Total Capacitance (uF) |
| 0 | 0 | 0 | 0 | 0 |
| 1 | 0 | 0 | 1 | 12 |
| 2 | 0 | 1 | 0 | 25 |
| 3 | 0 | 1 | 1 | 37 |
| 4 | 1 | 0 | 0 | 50 |
| 5 | 1 | 0 | 1 | 62 |
| 6 | 1 | 1 | 0 | 75 |
| 7 | 1 | 1 | 1 | 87 |

Table 2

The number of capacitors and their values are chosen as an example for the purpose of illustrating the principle of the presently claimed invention. Any number of capacitors and capacitance values can be adopted for the implementation of the presently claimed invention.

Figure 2A:
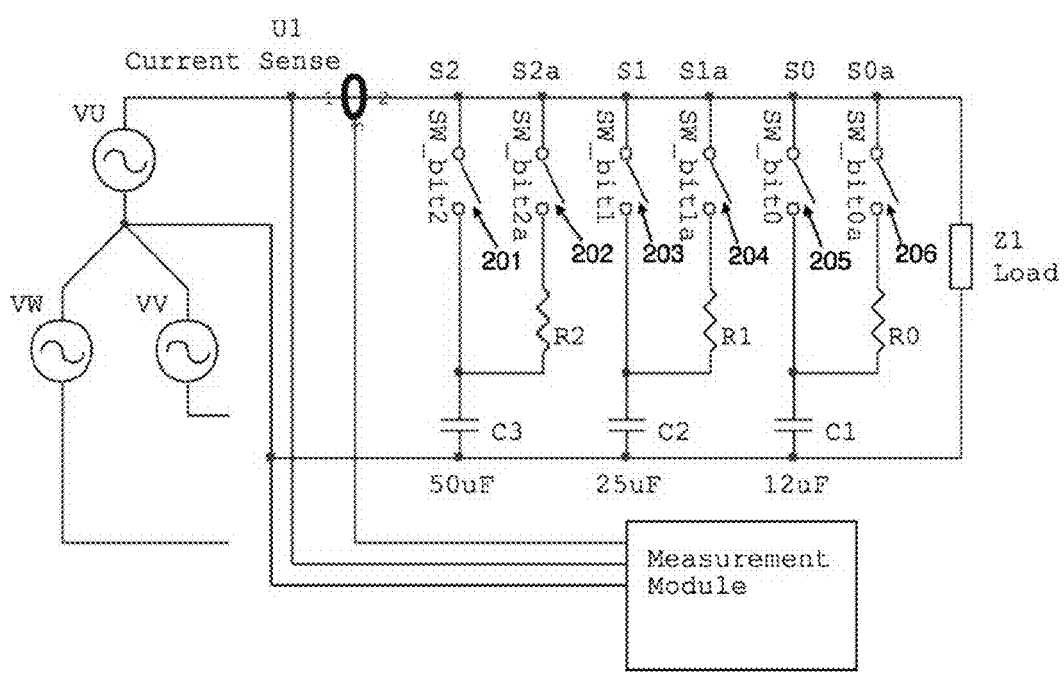
FIG. 2A shows a circuit diagram illustrating another exemplary electrical power circuitry incorporated with a computer-implementable control algorithm for passive power factor compensation based on differential capacitor change in accordance to another embodiment of the presently claimed invention.
Figure 2B:
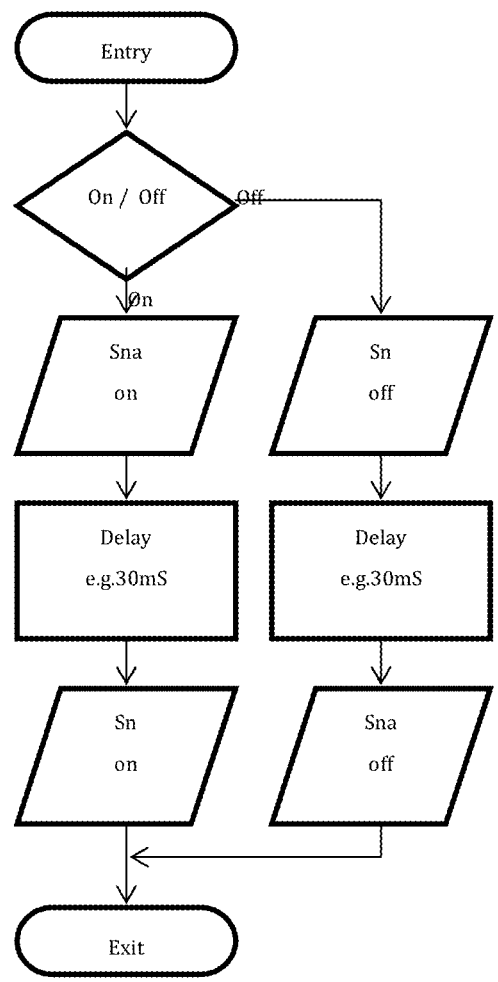
FIG. 2B depicts a flow chart illustrating the capacitor switching operation for the electrical power circuitry shown in FIG. 2A.

FIG. 2A shows a circuit diagram illustrating another exemplary electrical power circuitry incorporated with the computer-implementable control algorithm. In this electrical power circuitry, the capacitor switches are implemented with inrush relay. FIG. 2B depicts a flow chart illustrating the capacitor switching operation for this implementation. For example, to switch in the capacitor $C_3$, switch $SW_{bit2a}$ (202) is first switched on, wait for a delay period (e.g. 30 millisecond), then switch on $SW_{bit2}$ (201); to switch out the capacitor $C_3$, switch $SW_{bit2}$ (201) is first switched off, wait for a delay period (e.g. 30 millisecond), then switch of $SW_{bit2a}$ (202).

To determine the compensation capacitance required, a computation based on the following mathematical calculations is made:

Given:
Vac AC power line voltage
fl Line frequency
PF Power factor
P_real Real Power
P_apparent Apparent Power
P_reactive Reactive Power
φ Phase angle
I_reactive Reactive current
Z_cap Capacitive impedance
C_pfc PFC capacitance
Relationships $$P\_real = P\_apparent \cdot PF = P\_apparent \cdot \cos(\phi)$$

$$\cos(\phi)^2 + \sin(\phi)^2 = 1 \; PF^2 + \sin(\phi)^2 = 1$$

$$P\_reactive = P\_apparent \cdot \sin(\phi) = P\_apparent \cdot \sqrt{1 - PF^2}$$

$$P\_reactive = Vac \cdot I\_reactive = Vac \cdot \frac{Vac}{Z\_cap} = Vac \cdot \frac{Vac}{\frac{1}{2 \cdot \pi \cdot fl \cdot C\_pfc}} = Vac^2 \cdot 2 \cdot \pi \cdot fl \cdot C\_pfc$$

Convenient mean of determining compensation capacitance $$C\_pfc = \frac{P\_reactive}{2 \cdot \pi \cdot fl Vac^2}$$

In accordance to various embodiments of the presently claimed invention, the computer-implementable control algorithm relies on a measurement module for measuring: line voltage: Vac, line frequency: fl, reactive power: P_reactive, and sign of reactive power: +ve for lagging and −ve for leading (expressed as + or − power factor).

Figure 3A:
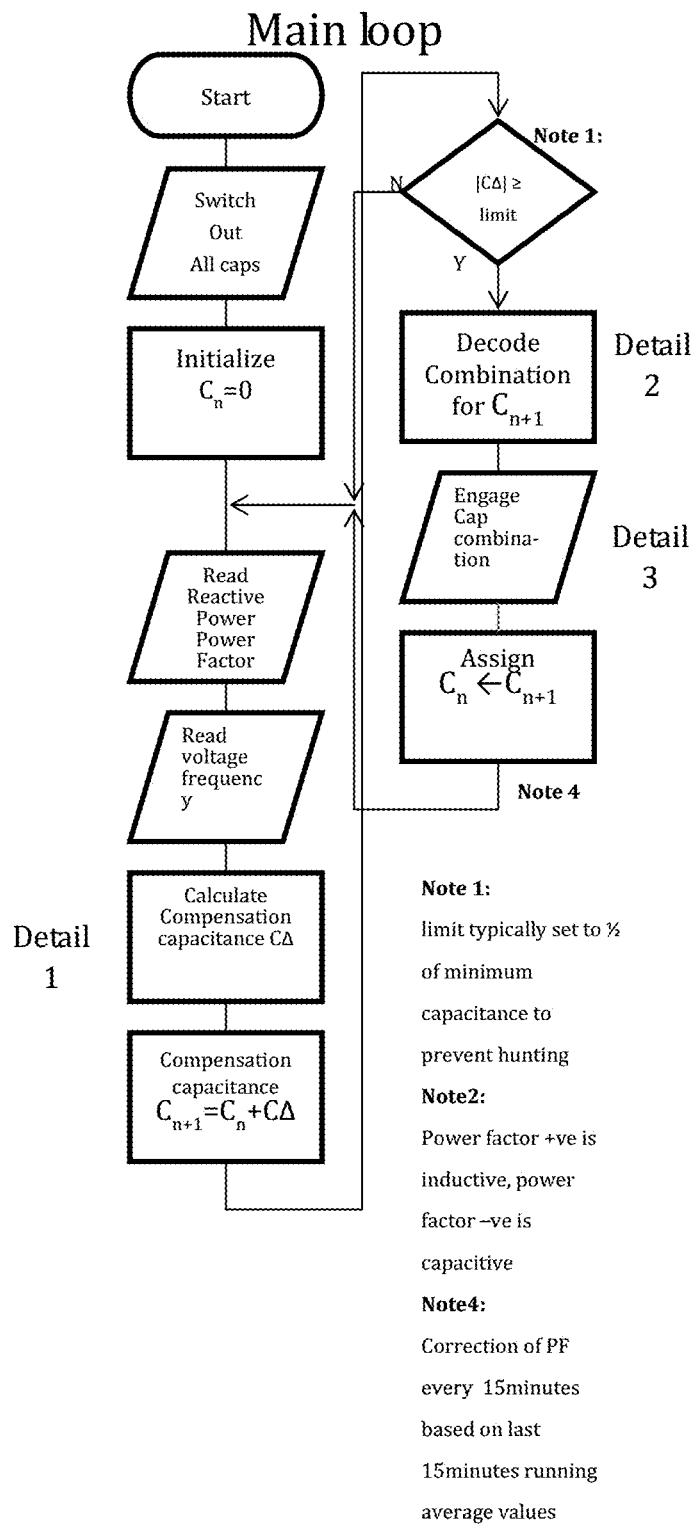
FIG. 3A, FIG. 3B, FIG. 3C, and FIG. 3D depict the flow charts illustrating the process steps of a computer-implementable control algorithm for passive power factor compensation based on differential capacitor change in accordance to yet another embodiment of the presently claimed invention.
Figure 3B:
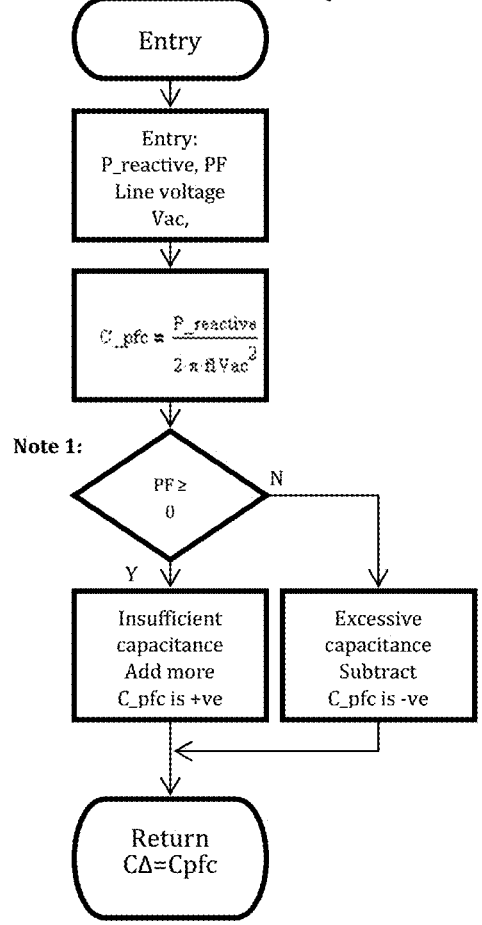
Figure 3C:
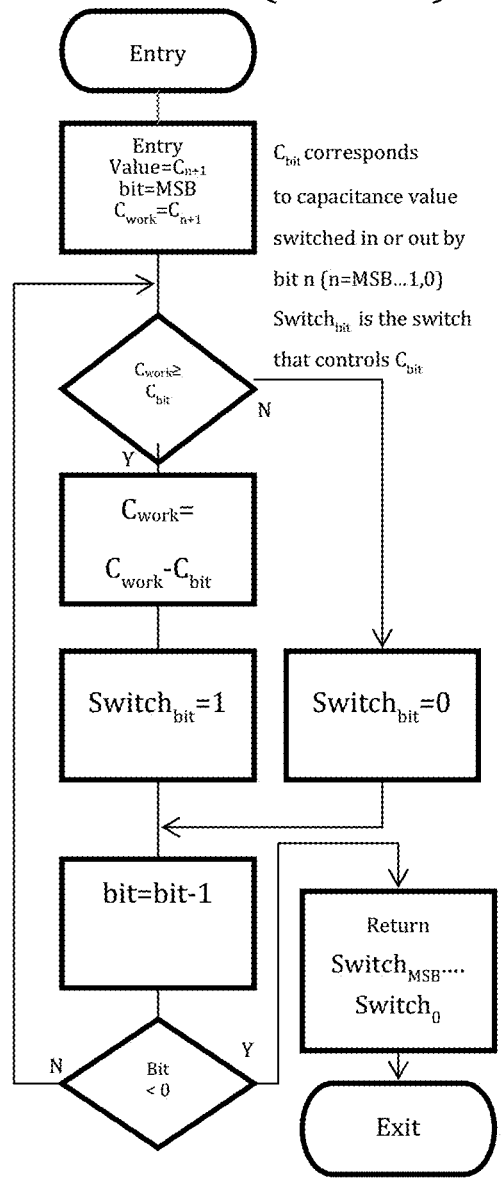
Figure 3D:
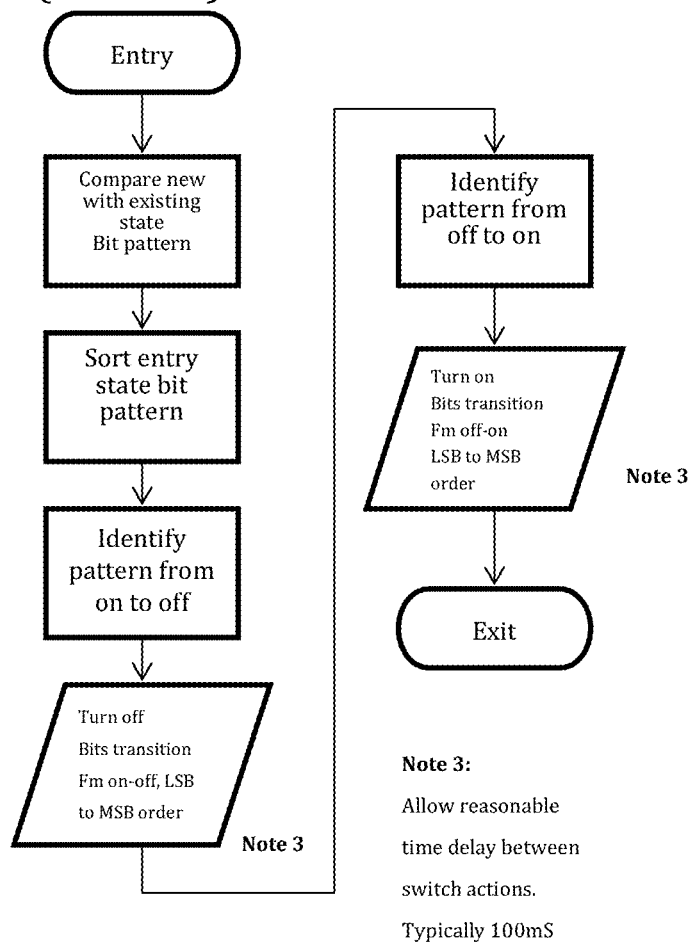
Figures 5A, 5B:
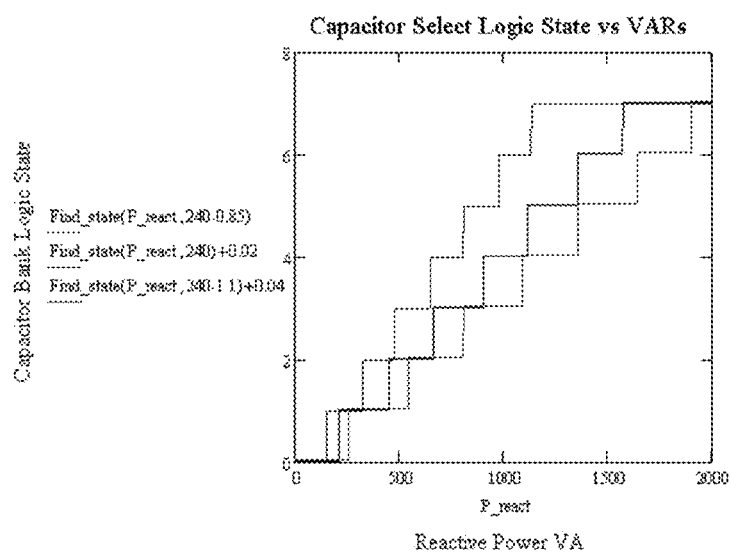
FIG. 5A shows a table listing the compensation capacitance values and parameters, and results of an exemplary implementation of the presently claimed invention.
FIG. 5B shows a chart of capacitor select logic state vs. reactive power.

FIG. 3A, FIG. 3B, FIG. 3C, and FIG. 3D depict flow chart illustrating the process steps of the computer-implementable control algorithm to automatically adjust the compensation capacitance. The flow chart in FIG. 3A illustrates the overall process, which comprises the following steps:

a. initializing existing capacitance value C_pfc to zero;
  b. acquiring the real time measurements, the measurements comprising: power factor; line voltage; line frequency, which can be measured data or default constant; reactive power; sign of reactive power, which can be determined from part of power factor measurement;
  c. calculating the compensation capacitance required, as shown in details in FIG. 3B, based on the equation:

$$C\_pfc = \frac{P\_reactive}{2 \cdot \pi \cdot flVac^2},$$

the calculation comprising: if the absolute value of C_pfc is larger than a predetermined limit value, preferably equal or larger than ½ of minimum capacitance step (this is to provide a hysterisis and prevent hunting), then add (if power factor is positive) or subtract (if power factor is negative) C_pfc to (add) or from (subtract) existing capacitance value;
  d. decode the capacitor combination (or positions and states of switches in binary form) for the compensation capacitance required as detailed in the flow chart shown in FIG. 3C;
  e. engage the newly decoded capacitor combination starting from the currently engaged capacitor combination as detailed in the flow chart shown in FIG. 3D; and
  f. repeating steps a to e every pre-determined time interval, typically fifteen minutes.

In accordance to one embodiment, the engagement of the suitable compensation capacitors based on new existing capacitance value comprises a series of steps as depicted in the flow chart shown in FIG. 3D. An example of such engagement with its corresponding bit pattern transition from 101 to 110 is illustrated in the table shown in FIG. 3E.

In accordance to various embodiments of the presently claimed invention, the computer-implementable control algorithm to automatically adjust the compensation capacitance is primarily implemented using a microcontroller (MCU). In this implementation, in the step of engaging of suitable compensation capacitance comprises, compensation capacitance values are loaded into the MCU from external sources to provide flexibility in adapting the algorithm to different power levels. For example, external non-volatile storage, such as EEprom, Flash, etc. is used to store the compensation capacitance values and parameters and read into MCU thru I/O interface. The compensation capacitance values and parameters are loaded into the non-volatile storage via an interface with a pre-defined protocol such as the UART, I2C, and USB. Additional firmware routine can be employed to verify the external non-volatile storage validity and halt the execution in case of corrupt data found. An exemplary embodiment of the data structure for the compensation capacitance values and parameters stored in external non-volatile storage is illustrated in the table shown in FIG. 4.

In accordance to various embodiment of the presently claimed invention, a logging of time stamped data of power line quality information is provided. The data comprises: MCU log power line information to non-volatile memory; time; voltage; line frequency, real power; reactive power; capacitor engaged or switch state; power factor if reactive power does not contain sign; ambient temperature; and checksum. The data structure should be able to indicate the number of phase(s) of the electrical system.

The embodiments disclosed herein may be implemented using general purpose or specialized computing devices, mobile communication devices, computer processors, or electronic circuitries including but not limited to digital signal processors (DSP), application specific integrated circuits (ASIC), field programmable gate arrays (FPGA), and other programmable logic devices configured or programmed according to the teachings of the present disclosure. Computer instructions or software codes running in the general purpose or specialized computing devices, mobile communication devices, computer processors, or programmable logic devices can readily be prepared by practitioners skilled in the software or electronic art based on the teachings of the present disclosure.

In some embodiments, the present invention includes computer storage media having computer instructions or software codes stored therein which can be used to program computers or microprocessors to perform any of the processes of the present invention. The storage media can include, but are not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A method for conducting passive power factor compensation based on differential capacitor change, comprising:
  a. acquiring real time electrical power circuit measurements comprising: power factor, line voltage, line frequency, reactive power, and sign of reactive power;
  b. determining a compensation capacitance required;
  c. determining the states of each of capacitor switches for engaging or disengaging their corresponding capacitors for achieving a total capacitance closest to the compensation capacitance required;
  d. forming a new capacitor combination according the states of each of the capacitor switches determined for the compensation capacitance required;
  e. first disengaging currently engaged capacitors in current capacitor combination one by one in ascending order starting with the capacitor with lowest capacitance and ending with the capacitor with highest capacitance, and after all capacitors are disengaged, engaging capacitors in the new capacitor combination one by one in ascending order starting with the capacitor with lowest capacitance and ending with the capacitor with highest capacitance to minimize line transient noise; and repeating above steps a-e every pre-determined time interval.

2. The method of claim 1, wherein the determination of the compensation capacitance required comprises:
calculating $$C\_pfc = \frac{P\_reactive}{2 \cdot \pi \cdot flVac^2},$$

where C_pfc is a differential compensation capacitance, P_reactive is the reactive power measured, Vac is the line voltage measured, and fl is the line frequency measured; and if an absolute value of the differential compensation capacitance is larger than a predetermined limit value, then adding, if the power factor measured is positive, or subtracting, if the power factor measured is negative, C_pfc to or from existing capacitance value, resulting in the compensation capacitance required.

3. The method of claim 2, wherein the predetermined limit value being equal or larger than ½ of minimum capacitance step.

4. The method of claim 1,
wherein positions and the states of the capacitor switches are represented in binary form;
wherein the capacitor switches being positioned in descending order according to their corresponding the capacitor capacitance values with the capacitor switch corresponding to the capacitor with highest capacitance being positioned at most significant bit (MSB) and the capacitor switch corresponding to the capacitor with lowest capacitance being positioned at least significant bit (LSB).

5. The method of claim 1, wherein each of engaging and disengaging of each capacitor being separated by a delay time interval.

* * * * *